United States Patent [19]
Baskett

[11] Patent Number: 5,110,758
[45] Date of Patent: May 5, 1992

[54] METHOD OF HEAT AUGMENTED RESISTOR TRIMMING

[75] Inventor: Ira E. Baskett, Tempe, Ariz.

[73] Assignee: Motorola, Inc., Schaumburg, Ill.

[21] Appl. No.: 709,060

[22] Filed: Jun. 3, 1991

[51] Int. Cl.[5] .................. H01L 21/14; H01L 21/306; H01L 21/326

[52] U.S. Cl. .................. 437/171; 437/170; 437/172; 437/918; 437/919; 148/DIG. 71

[58] Field of Search ........... 437/170, 171, 172, 913, 437/919; 148/DIG. 71

[56] References Cited

U.S. PATENT DOCUMENTS

| | | | |
|---|---|---|---|
| 4,467,312 | 8/1984 | Komatsu | 437/918 |
| 4,505,490 | 4/1986 | Raffel et al. | 437/199 |
| 4,560,583 | 12/1985 | Monsvold | 437/918 |
| 4,606,781 | 8/1986 | Vync | 437/170 |
| 4,707,909 | 11/1987 | Blanchard | 148/DIG. 71 |
| 4,713,680 | 12/1987 | Davis et al. | 437/51 |
| 4,810,663 | 3/1989 | Raffel et al. | 437/171 |

Primary Examiner—Brian E. Hearn
Assistant Examiner—Kevin M. Piiardat
Attorney, Agent, or Firm—Joe E. Barbee

[57] ABSTRACT

An improved method of trimming resistors by metal migration by local heating (18,21) of the resistor (23) to allow a reduced level of electric current to be used. The resistor is then trimmed by application of short pulses of high current causing metal migration (22). Each pulse decreases the resistance progressively until a desired final value is achieved. The reduced level of current of the improved method requires a reduced voltage across the resistor thus extending the earlier method to allow higher valued resistors, or lower breakdown voltages. The localized heating (18,21) is also used to anneal the migrated metal after trimming to increase the long term stability of the resistor (23). The intensity of the localized heating (18,21) can be varied to induce a desired shape in the migrated metal (22).

16 Claims, 1 Drawing Sheet

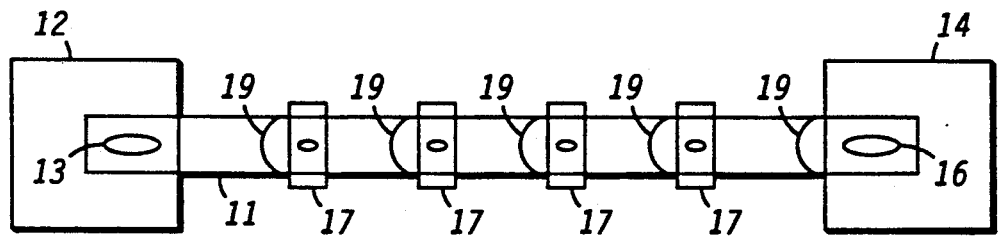
FIG. 1
-PRIOR ART-
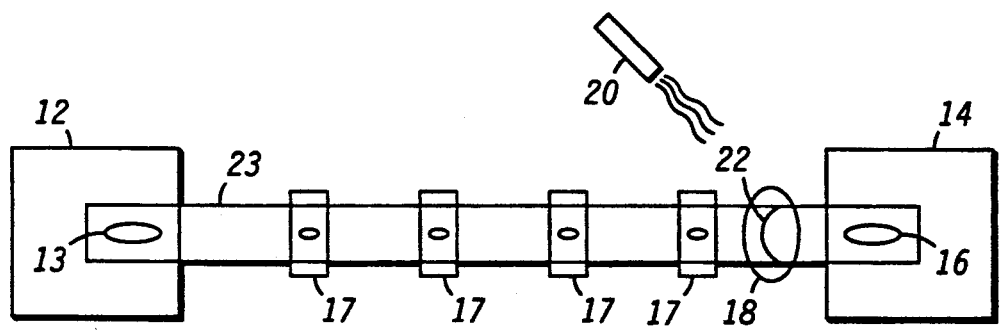
FIG. 2
FIG. 3
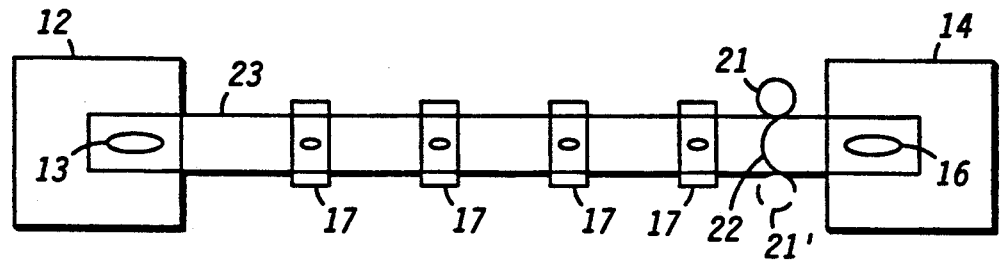

METHOD OF HEAT AUGMENTED RESISTOR TRIMMING

Incorporated herein by reference is related patent by Robert L. Vyne, Tempe, Ariz., assigned to the same assignee: U.S. Pat. No. 4,606,781, issued Aug. 19, 1986, entitled "Method for Resistor Trimming by Metal Migration".

BACKGROUND OF THE INVENTION

The present invention relates, in general, to a method for trimming an electrical component that is located within an integrated circuit, and more particularly to a method for trimming resistors by the use of metal migration augmented by laser heating.

The above referenced patent discloses a method of trimming the ohmic value of a resistor which has previously been fabricated on an integrated circuit wafer. The trimming process uses the mechanism of metal migration to reduce the value of a resistor until a precise, desired ohmic value is achieved. The trimming is typically accomplished by pulsing the resistor with high amplitude, small duty cycle current pulses. The approach is especially useful in a high volume manufacturing environment, having clear advantages over other methods such as laser trimming, link blowing or zener zapping. The resistors trimmed by metal migration (RTMM) occupy very little of the integrated circuit die area. Some resistor trimming methods devote 25% of the integrated circuit die area to trim and protection circuitry. When using the RTMM structure a test computer performs a trim algorithm rather than digital logic on the chip. The RTMM structure can be trimmed after the integrated circuit is packaged. The RTMM structure exhibits increased accuracy and resolution when compared to other methods of producing trimmed resistors. They can undergo a resistance change as small as 25 milliohms/pulse on a 25 ohm resistor. Finally, no additional expensive equipment is required. The part is trimmed at the same time as it is tested and using the same equipment.

Assuming the use of silicon for the substrate and resistor with aluminum metal being migrated to trim the resistor. A small duty cycle current pulse is applied to the RTMM. Electron momentum exchange causes movement of silicon and aluminum atoms in the direction of current flow. This phenomenon is commonly referred to as electromigration. Electromigration causes an aluminum filament to grow from the positive terminal to the negative terminal, dissolving silicon as it grows. As the filament grows the ohmic value of the resistor decreases. Repeated application of the current pulse further decreases the ohmic value of the resistor until a desired final value is obtained.

A junction isolated resistor is limited in the maximum voltage it can withstand by the breakdown limits of the junction. This limits the maximum current which can be passed through the resistor for a particular value of resistance. In practice this serves to limit both the maximum value of resistance and the maximum sheet resistivity which can be used for an RTMM. The high current required can also cause particles or other contaminants to move damaging the structure of the semiconductor die. The widespread heat produced by the trimming current can cause cracks in the silicon dioxide layers in the vicinity of the resistor. Finally annealing of the migrated metal is required after trimming to achieve a stable resistance value. Typically this is achieved by passing a lower current through the resistor than is required for metal migration. The level of this current and the exact duration of the current is hard to control adequately. There is a need for an improved method of trimming resistors by metal migration which extends the RTMM capability to allow higher valued resistors, more stability after trimming, and use with a low voltage process.

SUMMARY OF THE INVENTION

Briefly stated, the present invention provides an improved method of trimming resistors by metal migration by local heating of the resistor to allow a reduced level of electric current to be used. The resistor is then trimmed by application of short pulses of high current causing metal migration. Each pulse progressively decreases the resistance until a desired final resistance value is achieved. The reduced level of current of the improved method requires a reduced voltage across the resistor, extending the earlier method to allow higher valued resistors or lower resistor breakdown voltages. The localized heating is also used to anneal the migrated metal after trimming to increase the long term stability of the resistor. The intensity of the localized heating can be varied to induce a desired shape in the migrated metal.

BRIEF DESCRIPTION OF THE DRAWINGS

FIG. 1 is a top view of a resistor being trimmed by metal migration according to the prior art;

FIG. 2 is a top view of a resistor being trimmed in accordance with the present invention;

FIG. 3 is a top view of the resistor of FIG. 2 being trimmed in accordance with an alternative embodiment of the present invention.

DETAILED DESCRIPTION OF THE DRAWINGS

FIG. 1 is a top view of a resistor 11 being trimmed by metal migration in accordance with the prior art. Resistor 11 is fabricated as a component of an integrated circuit on a semiconductor die (not shown). Resistor 11 may be fabricated by methods well known in the art as a doped region of a semiconductor substrate through ion implantation or diffusion of a predetermined impurity. One end of resistor 11 is electrically connected to a metallic contact means 12 through a preohmic contact 13. Likewise the opposite end of resistor 11 is electrically connected to a metallic contact means 14 through a preohmic contact 16. A plurality of additional metallic contact means 17 are arranged along resistor 11. Each additional metallic contact means 17 comprises a metal pad and a preohmic contact. The metal pad is optionally coupled to other circuit elements on the integrated circuit. Additional metallic contact means 17 serve to supply added metal for migration to facilitate the trimming process.

In accordance with the method of the prior art, an electric current is passed between contact means 12 and contact means 14 in one direction and of sufficient magnitude to cause electromigration of a plurality of migrated metal 19. A current of approximately 250 milliamperes is required for this effect in a typical RTMM structure, although the current required may be as high as 650 milliamps. The applied voltage is limited by the diode breakdown voltage of the diode formed between resistor 11 and the substrate. A typical value for this maximum voltage is approximately 25 volts, limiting the maximum resistance value to approximately 100 ohms. Other semiconductor processes which use the RTMM have breakdown voltages as low as 7 volts, limiting the maximum RTMM to a value of 28 ohms. The high current required can also cause particles or other contaminants to move damaging the structure of the semiconductor die. The widespread heat produced by the migration current can cause cracks in the silicon dioxide layers in the vicinity of the resistor. Finally annealing of the migrated metal is required after trimming to achieve a stable resistance value. Typically this is achieved by passing a lower current through the resistor than is required for metal migration. The level of this current and the exact duration of the current is hard to control adequately.

FIG. 2 is a top view of a resistor 23 being trimmed by metal migration augmented by local heating as a first embodiment of the present invention. The structure of resistor 23 is identical to that of resistor 11 (FIG. 1), except that the range of ohmic resistance values allowed is much greater. Any of the alternative structures of resistor 11 (FIG. 1) provided by the prior art may also be used with the improved trimming methods which embody the present invention. In addition to the fabrication methods used for resistor 11 (FIG. 1) the improved trimming method of this embodiment in allowing a greater range of resistance values, also allows resistor 23 to be fabricated using high sheet resistivity material. This permits fabricating the resistor from a doped polycrystalline semiconductor material such as polysilicon.

In this first embodiment of the present invention, a localized heating means 20 such as a focusable infrared heater or laser beam is focused onto a hot spot 18 to heat a predetermined portion of resistor 23 in which metal migration is desired. A small current is then passed between contact means 12 and contact means 14 in one direction and of sufficient magnitude to cause electromigration of migrated metal 22. In contrast to the method of FIG. 1, the magnitude of the current is less than that required to induce electromigration in an unheated resistor. Electromigration using a method according to the present invention takes place only at a single location as shown by migrated metal 22 rather than the multiple locations shown by migrated metal 19 (FIG. 1). As trimming proceeds, migrated metal 22 will extend beyond the location of metallic contact means 17 whereupon metallic contact means 17 will supply metal to continue the electromigration process.

The exact current required varies with the temperature at hot spot 18 and the desired change required with time. Electromigration is induced with an arbitrarily small, but nonzero, current if the heating of hot spot 18 is sufficient. In general a lower current is used for higher resistance values. However a value for the current required for a typical resistor 23 having a starting ohmic value of approximately 1000 ohms is approximately 20 milliamps. In the method of the prior art the current was applied in a pulse having a typical duration of 20 milliseconds due to the high current level of approximately 250 milliamps. Embodiments of the present invention, requiring significantly lower current levels, typically use a pulse width as short as 50 microseconds with a pause to allow measurement of the ohmic value of resistor 23. This can result in spacings between pulses of as long as one second to allow resistor 23 to cool before measurement. It should be understood that the typical pulse widths and repetition rates are not critical and that an extremely wide range of pulse timings may be used. Alternative embodiments use a continuous direct current flow which is monitored and removed when the desired ohmic resistance value is obtained.

For electromigration to occur, resistor 23 must be heated to a temperature of the order of 500 degrees Celsius or close to the alloying temperature of the semiconductor material. In this embodiment of the invention, the heat is concentrated in a small area so the total heating of the semiconductor die is reduced. This alleviates many of the problems of the prior art which were due to excessive heat, such as cracks due to overheating, migration of particles and migration of other contaminants. In the prior art, annealing of migrated metal 19 (FIG. 1) required a critical level of current for a specific length of time. Embodiments of the present invention perform annealing by simply continuing to heat migrated metal 22 with hot spot 18, a much less complex technique.

FIG. 3 is a top view of resistor 23 being trimmed by metal migration augmented by local heating as a preferred embodiment of the present invention. In this embodiment the localized heating means 20 (FIG. 2) is focused into a small hot spot 21. Small hot spot 21 is much smaller than hot spot 18 (FIG. 2), and in addition is moved back and forth across the width of resistor 23 between the original position and the location of small hot spot 21'. Electromigration is typically induced by application of a pulsed current in the same way as the embodiment of FIG. 2, although a continuous current is used in other embodiments which use small hot spot 21. Small hot spot 21 is typically derived from a high intensity focused laser beam, but those skilled in the art can readily see how any of a variety of radiant heat sources can be used. Small hot spot 21 is moved from place to place by steering the radiant heating beam using optical means well known in the art. Typically this movement is controlled in a specific pattern so as to vary the intensity of the selective heating of resistor 23 such that migrated metal 22 is formed into a desired shape. Due to the low electric current levels used, electromigration occurs only in the region heated by small hot spot 21, giving precise control over the electromigration process.

Using the method of the prior art, migrated metal 19 (FIG. 1) tends to form as thin "whiskers" of metal which do not have the long term stability exhibited by wider metal shapes. The preferred embodiment moves small hot spot 21 over the width of resistor 23 to the position of small hot spot 21' (shown in phantom) and back. The speed of this motion is varied to control the heating in such a way as to assure that migrated metal 22 is uniformly distributed across the width of resistor 23. Each increment of migrated metal 22 is grown and then allowed to widen, stabilize, and anneal to ensure the maximum stability of value after trimming. The process of electromigration is continued, reducing the resistance of resistor 23 until the desired resistance value is achieved. If migrated metal 22 is extended beyond metallic contact means 17 the metal material required is supplied by metallic contact means 17. Thus the electromigration rate remains approximately constant for the entire length of resistor 23.

By now it should be clear that the present invention provides an improved method of trimming resistors by metal migration. The method comprises using a concentrated heat source which reduces the current required to induce electromigration and allows a very fine control over the electromigration process. The lower current required extends the capability to allow high valued resistors, use with high sheet resistivity material and use with a low voltage process. In addition annealing of the migrated metal is facilitated providing more stability after trimming.

I claim:

1. A method of heat augmented resistor trimming, comprising:

providing a resistor having a first end and a second end as a component of an integrated circuit;

contacting the first end by means of a first metallic contact means located proximate to the first end;

contacting the second end by means of a second metallic contact means located proximate to the second end;

selectively heating the resistor to reduce the level of electrical current required to cause metal to migrate from the first end toward the second end;

migrating metal from the first metallic contact means toward the second metallic contact means by application of an electric current in a predetermined direction between the first contact means and the second contact means thereby increasing the conductivity between the first metallic contact means and the second metallic contact means; and stopping the flow of electrical current when a desired conductivity between the first metallic contact means and the second metallic contact means is obtained.

2. The method of heat augmented resistor trimming of claim 1 further comprising:

selectively heating the resistor by use of a laser beam.

3. The method of heat augmented resistor trimming of claim 1 further comprising:

selectively heating the resistor by use of a focused infrared spot heater.

4. The method of heat augmented resistor trimming of claim 1 further comprising:

annealing the metal by causing an electrical current to flow in one direction between the first contact means and the second contact means, the electrical current being sufficient to heat the resistor but being insufficient to cause further migration of the metal.

5. The method of heat augmented resistor trimming of claim 1 further comprising:

annealing the metal by further selective heating of the resistor after the desired conductivity between the first metallic contact means and the second metallic contact means is obtained.

6. The method of heat augmented resistor trimming of claim 1 further comprising:

applying the electrical current as at least one pulse having a predetermined duration.

7. The method of heat augmented resistor trimming of claim 6 further comprising:

annealing the metal by applying the electrical current as at least one pulse, the magnitude and duration of the pulse being sufficient to heat the resistor but being insufficient to cause further migration of the metal.

8. The method of heat augmented resistor trimming of claim 1 further comprising:

providing at least one metallic contact means in addition to the first and second contact means.

9. The method of heat augmented resistor trimming of claim 1 further comprising:

fabricating the resistor by diffusion of an impurity material into a semiconductor substrate.

10. The method of heat augmented resistor trimming of claim 1 further comprising:

fabricating the resistor by implanting ions of an impurity material into a semiconductor substrate.

11. The method of heat augmented resistor trimming of claim 1 further comprising:

fabricating the resistor from a doped polycrystalline semiconductor material.

12. The method of heat augmented resistor trimming of claim 1 further comprising:

varying the intensity of the selective heating of the resistor such that the migrated metal is formed into a desired shape.

13. The method of heat augmented resistor trimming of claim 1 wherein providing the resistor comprises providing a resistor having an initial ohmic value of greater than 100 ohms.

14. The method of heat augmented resistor trimming of claim 1 further comprising:

migrating metal from the first metallic contact means toward the second metallic contact means by application of an electric current having a maximum current level of less than 250 milliamps.

15. A method of heat augmented resistor trimming, comprising:

providing a resistor within a semiconductor device, the resistor having first and second ends;

contacting the first end by means of a first metallic contact means located in proximate to the first end;

contacting the second end by means of a second metallic contact means located in proximate to the second end;

heating the resistor to reduce the level of electrical current required to cause metal to migrate from the first end toward the second end;

causing an electrical current to flow in at least one pulse of predetermined duration and direction between the first contact means and the second contact means, the level of electrical current and the duration of the pulse being sufficient to cause metal to migrate from the first end toward the second end thereby reducing the ohmic value of resistance between the first end and the second end; and stopping the at least one pulse of electrical current when the desired conductivity between the first metallic contact means and the second metallic contact means is obtained.

16. A method of heat augmented resistor trimming, comprising:

providing a resistor within a semiconductor device, the resistor having first and second ends;

contacting the first end by means of a first metallic contact means located in proximate to the first end;

contacting the second end by means of a second metallic contact means located in proximate to the second end;

heating the resistor by means of a laser beam focused on the resistor;

migrating metal from the first metallic contact means toward the second metallic contact means by application of an electric current in at least one pulse of predetermined duration and in a predetermined direction between the first contact means and the second contact means, the level of electric current and the duration of the pulse being sufficient to cause metal to migrate from the first metallic contact means toward the second metallic contact means thereby reducing the ohmic value of resistance between the first metallic contact means and the second metallic contact means;

stopping the flow of electrical current when the conductivity between the first metallic contact means and the second metallic contact means is obtained; and annealing the metal by further selective heating of the resistor after the desired conductivity between the first metallic contact means and the second metallic contact means is obtained.

* * * * *

UNITED STATES PATENT AND TRADEMARK OFFICE
CERTIFICATE OF CORRECTION

PATENT NO. : 5,110,758

DATED : May 5, 1992

INVENTOR(S) : Ira E. Baskett

It is certified that error appears in the above-identified patent and that said Letters Patent is hereby corrected as shown below:

Claim 16, column 7, line 9, before "conductivity", insert --desired--.

Signed and Sealed this

Twenty-sixth Day of October, 1993

Attest:

BRUCE LEHMAN

Attesting Officer

Commissioner of Patents and Trademarks